(12) United States Patent
Pickles et al.

(10) Patent No.: US 6,454,588 B1
(45) Date of Patent: Sep. 24, 2002

(54) CONTACT OF SOCKET CONNECTOR

(75) Inventors: Charles S. Pickles, York, PA (US); Sung Pei Hou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/016,890

(22) Filed: Dec. 13, 2001

(51) Int. Cl.[7] .................................................. H01R 4/50
(52) U.S. Cl. ........................................ 439/342; 439/862
(58) Field of Search ................... 439/342, 259, 439/862

(56) References Cited

U.S. PATENT DOCUMENTS

| | | | | |
|---|---|---|---|---|
| 5,454,727 A | * | 10/1995 | Hsu | 439/342 |
| 5,492,488 A | * | 2/1996 | Hsu | 439/342 |
| 6,152,757 A | * | 11/2000 | Szu | 439/342 |
| 6,312,276 B1 | * | 11/2001 | Lin | 439/342 |

* cited by examiner

Primary Examiner—Tho D. Ta

(74) Attorney, Agent, or Firm—Wei Te Chung

(57) ABSTRACT

A connector for mounting a central processing unit module to a circuit board includes an insulation portion carrying the module and contacts retained in cells defined in the insulation portion and electrically connected to the circuit board. The contacts are made by stamping a metal plate which forms a carrier strip carrying a number of contact blanks that form the contacts after subsequent processing. Each contact includes an elongate flat body having a primary surface and extending in an axial direction. A soldering pad extends from a lower end of the body for carrying a solder ball attached to the circuit board. A retaining arm extends from an upper end of the body in an inclined direction with respect to the axial direction for interferentially engaging the housing to retain the contact in the cell. A spring arm is formed by bending an inclined extension from a side edge of the body in an inclined direction about a connection between the spring arm and the body whereby the spring arm is inclined with respect to the primary surface and the axial direction. The spring arm is engageable with a pin leg of the module for establishing electrical engagement therebetween. Since each contact has only a single spring arm, the contact blanks can be arranged in a more compact manner along the carrier strip with a distance substantially corresponding the span of a single spring arm therebetween for saving space and material.

10 Claims, 5 Drawing Sheets

CONTACT OF SOCKET CONNECTOR

BACKGROUND OF THE INVENTION

1. Field of the Invention

The present invention generally relates to a socket connector for mounting an electronic device, such as a central processing unit (CPU) module, to a circuit board, and more particular to a contact of the socket connector having a cost- and material-saving structure.

2. The Related Arts

Socket connectors for mounting an electronic device, such as a central processing unit (CPU) module, to a circuit board are well known and commonly used in the computer industry. FIG. 1 of the attached drawings shows an example of the socket connectors that is referred to as ZIF (Zero Insertion Force) socket connector. The socket connector, generally designated with reference numeral 10, comprises a base or housing 12 defining an array of open cells 14 in which contacts (not shown in FIG. 1) are received and a cover 16 movably supported on the base 12. The cover 16 defines through holes 18 corresponding to the cells 14 of the base 12. The cover 16 is capable to carry a CPU module 20 with pin legs 22 of the CPU module 20 extending through the holes 18 of the cover 16 and partially into the cells 14. An actuator 24 drives the cover 16 in such a manner to bring the pin legs 24 of the CPU module 20 into contact with the contacts of the base 12 thereby forming electrical connection therebetween. Examples of socket connectors of this type are also disclosed in U.S. Pat. Nos. 4,498,725, 5,833,483, 6,059,596, 6,142,810, and 6,159,032.

FIG. 2 of the attached drawings shows a contact, designated with reference numeral 26, received in each of the open cells 14 of the base 12 of the conventional socket connector 10. The contact 26 is made by stamping a metal plate as shown in FIG. 3. The contact 26 comprises a flat body 28 interferentially fit in the cell 14, two spring arms 30 which are bent from the flat body 28 to be substantially opposite to each other and a solder pad 32 also bent from the flat body 28 to be substantially perpendicular thereto for carrying a solder ball (not shown). As shown in FIG. 3, a number of contact blanks 26' (that will finally form the contacts 26) are lined up and connected to a carrier strip 34 after the stamping operation. To save material of the metal plate that makes the contacts 26, the contact blanks 26' are arranged as close to each other along the carrier strip 34. However, the dual spring arm structure of the contact 26 requires that a distance between adjacent contact blanks 26' be at least as large as twice the span of the spring arm 30 of the contact 26. Practically, such a distance is about 2.54 mm. However, the center-to-center distance between adjacent cells 14 of the connector housing 12 is 1.27 mm, that is half of the distance between adjacent contact blanks 26' along the carrier strip 34. For each line of the cells 14 of the base 12, a contact fitting process that handles a single carrier strip 34 can only place the contacts 26 into every other ones of the cells 14. Thus to completely fill the line of the cells 14, two contact fitting processes must be performed. This is generally not a time- and cost-efficient manner.

Further, arranging contacts along a carrier strip with a double span between adjacent contacts is a waste of material of the metal plate because a large portion of the material between the flat bodies of adjacent contacts will be stamped away.

SUMMARY OF THE INVENTION

Thus, it is an object of the present invention to provide a contact structure wherein contact blanks are arranged along a carrier strip with a single span between adjacent contact blanks so as to enhance assemblage of the contacts in a housing and reduce waste of material.

Another object of the present invention is to provide a contact for a socket connector, the contact having a simplified structure so as to reduces costs of manufacture.

To achieve the above objects, in accordance with the present invention, a contact for a socket connector is provided. The contact is made by stamping a metal plate whereby a number of contact blanks are formed and equally-spaced along a carrier strip that partly constitutes the metal plate. The contact has a single spring arm whereby the distance between adjacent contact blanks along the carrier strips is substantially corresponding to a single arm span, thereby saving material between adjacent contact blanks. The single arm span distance between adjacent contact blanks allows the contacts to be arranged in a more compact fashion along the carrier strip and thus assembling the contacts to a housing can be done more efficiently. Each contact blank comprises an elongate flat body having, at a first end thereof, an enlarged section and, at a second end thereof, a first inclined extension. A second inclined extension projects from a lateral side edge of the flat body and is substantially parallel to the first inclined extension. The enlarged section is attached to the carrier strip by a ready-to-separate connection that allows a finally formed contact to be readily separated from the carrier strip. The flat body has a first major surface. The enlarged section is bent approximately 90 degrees to form a soldering pad substantially perpendicular to the first surface for carrying a solder ball. The first extension is coplanar to the first surface. The second extension is bent at an angle no more than 90 degrees whereby the second extension is inclined with respect to the first surface and a lengthwise direction of the flat body. The contact is fit into a cell defined in a housing with the first extension, functioning as retaining arm, interferentially fit into a slot defined inside the cell to secure the contact in the housing. The second extension, functioning as a spring arm, is arranged to be substantially corresponding to a moving direction of a corresponding pin leg of a central processing unit module. The inclination of the spring arm provides resiliency of the spring arm for firmly engaging the pin leg.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
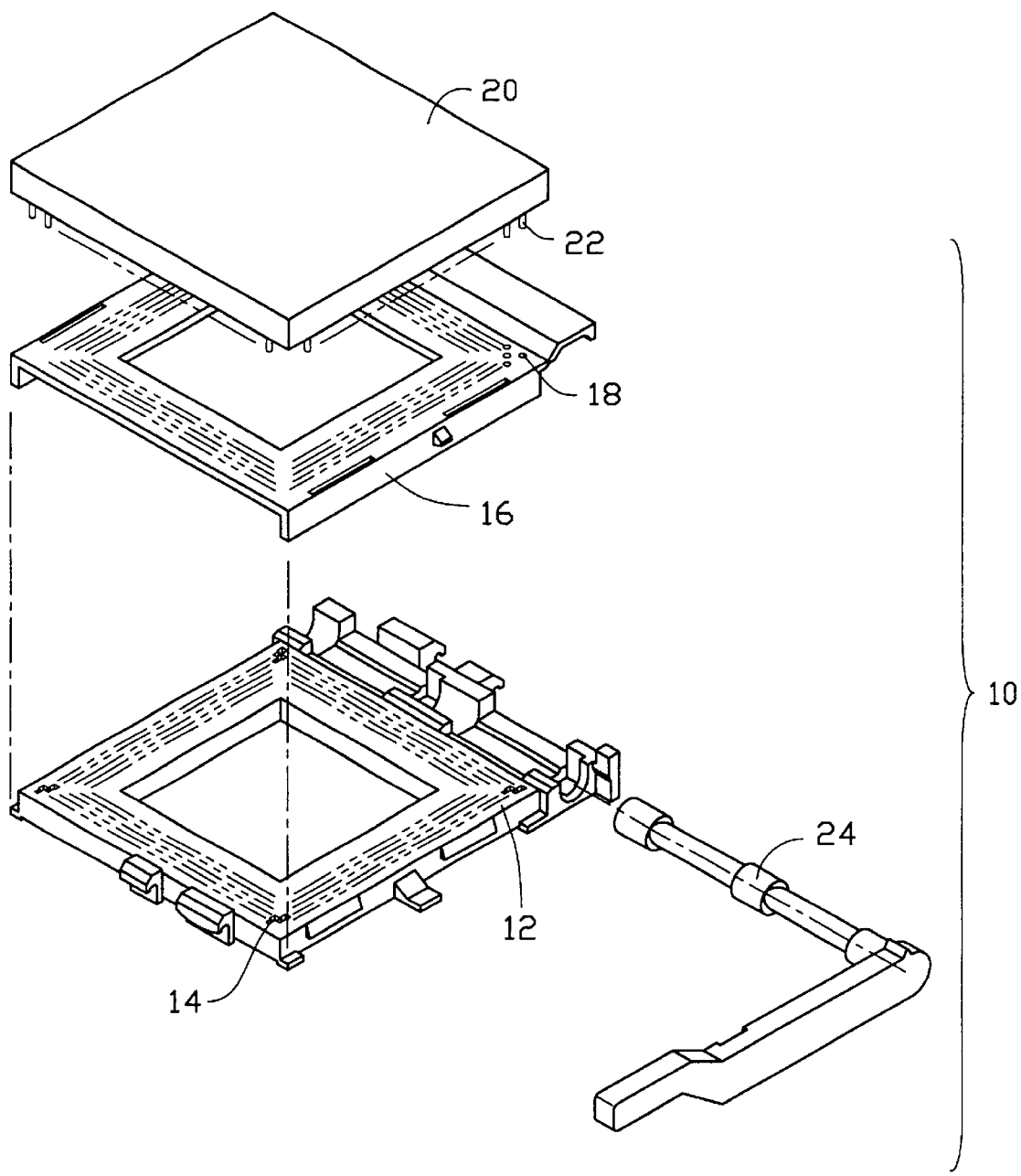
FIG. 1 is an exploded view of a conventional socket connector.
Figure 2:
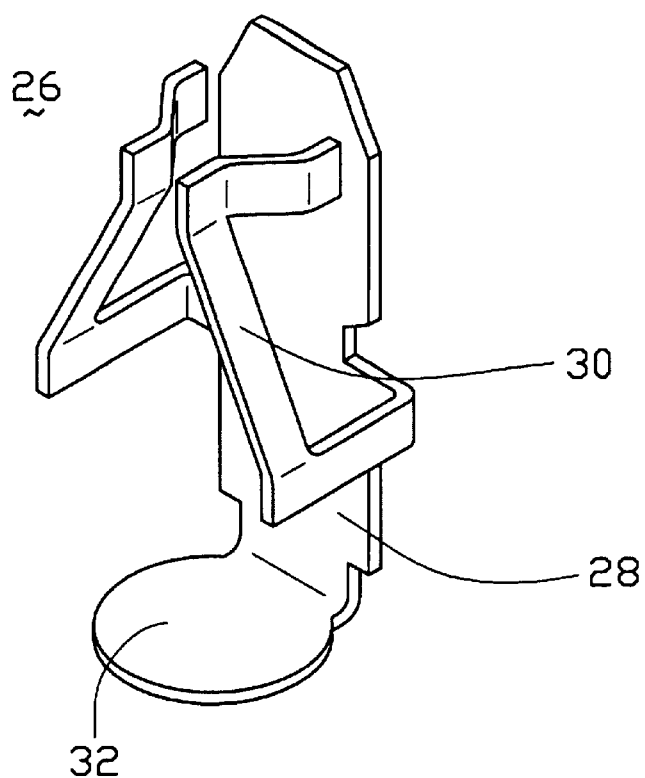
FIG. 2 is a perspective view showing a conventional contact of a socket connector.
Figure 3:
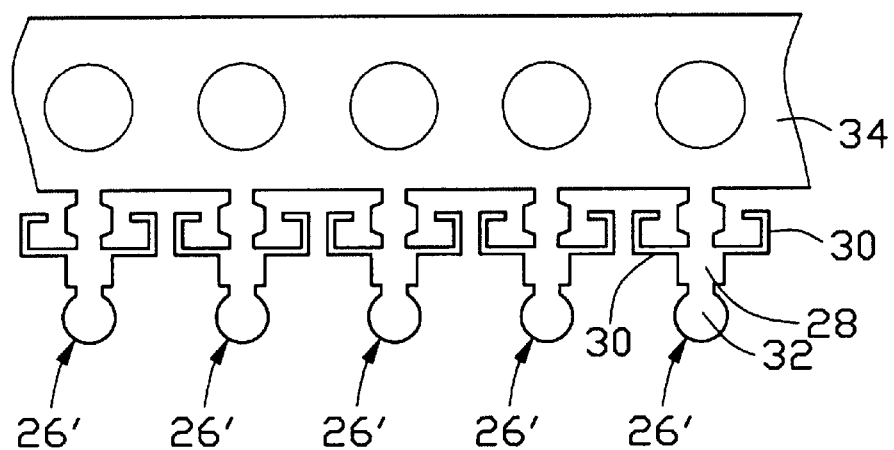
FIG. 3 is a plan view showing a number of contact blanks mounted to a carrier strip, the contact blanks being further processed to each form the contact of FIG. 2.
Figure 4:
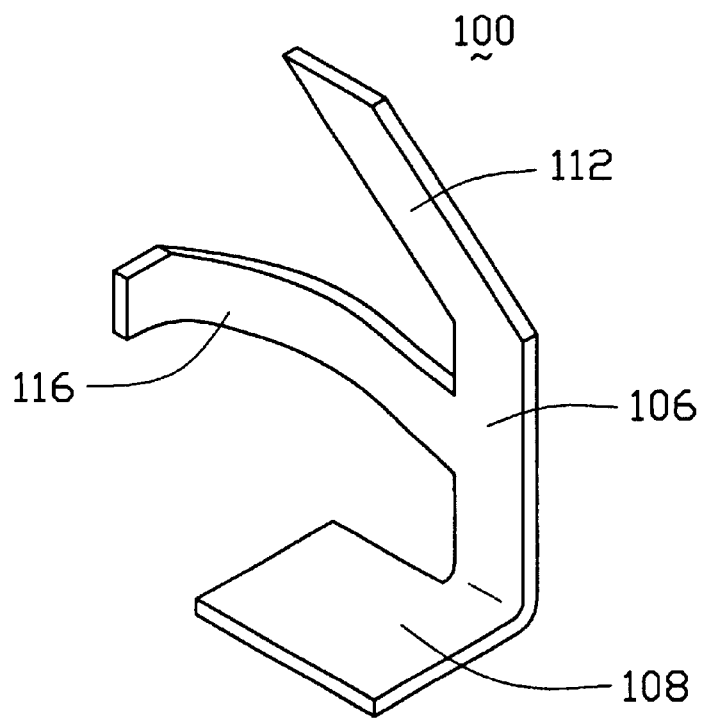
FIG. 4 is a perspective view of a contact of socket connector constructed in accordance with the present invention.
Figure 5:
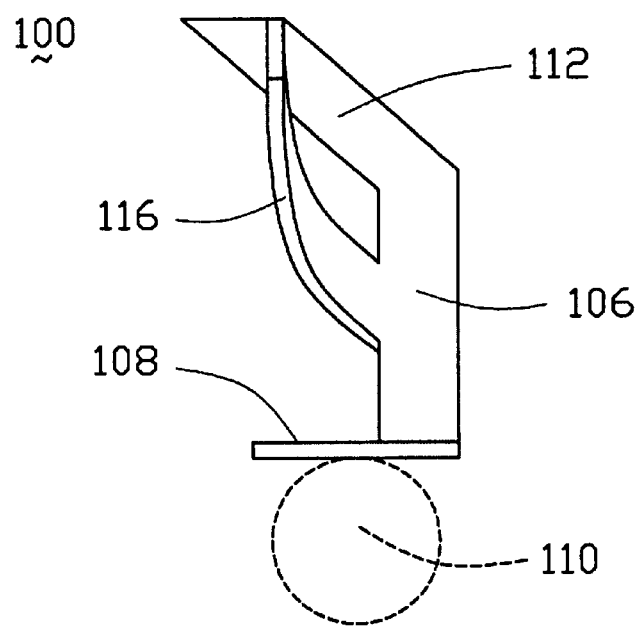
FIG. 5 is a front view of the contact of the present invention.
Figure 6:
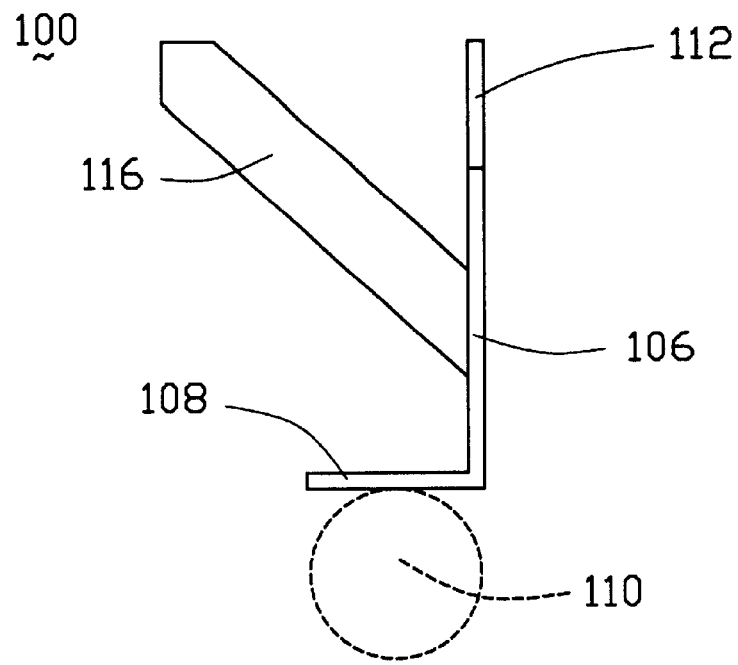
FIG. 6 is a side elevational view of the contact of the present invention.

With reference to the drawings and in particular to FIGS. 4–8, an electrical contact constructed in accordance with the present invention, generally designated with reference numeral 100, is to be received and retained in a cell 102 defined in a housing 104 of a socket connector. A pin leg 90 of an electronic device (not shown), such as a central processing unit module, is receivable in the cell 102 and is movable with respect to the housing 104 and the contact 100 in a moving direction A (FIG. 8), from the position illustrated with solid lines to the position illustrated with dashed lines, to bring the pin leg 90 into contact with the contact 100 and establish electrical engagement therebetween.

The contact 100 comprises a flat body 106 extending along a vertical axis on a primary surface and having lower and upper ends. An soldering pad 108 is formed on the lower end of the body 106 and is substantially perpendicular to the primary surface. The soldering pad 108 of the body 106 functions to carry a solder ball 110 (shown in dashed lines in FIGS. 5 and 6). The contact 100 is arranged in the cell 102 of the housing 104 with the solder ball 110 at least partially projecting beyond the housing 104 for attaching to a circuit board (not shown).

A retaining arm 112 extends from the upper end of the flat body 106 in a direction inclined with respect to the vertical axis of the flat body 106. In the embodiment illustrated, the retaining arm 112 is a flat member coplanar with the flat body 106 and is thus substantially on the primary surface. The retaining arm 112 is interferentially fit into a slot 114 defined in the connector housing 104 and in communication with the cell 102 for securely retaining the contact 100 within the cell 102. In this respect, the retaining arm 112 can be slightly deformed or twisted to insure the interferential engagement thereof with the slot 114. It is apparent to those having ordinary skills to form the slot 114 as part of the cell 102 without departing from the spirit of the present invention, as long as an interferential engagement can be established between the retaining arm 112 of the contact 100 and a portion of the housing 102.

A spring arm 116, being a flat member, extends from a side edge (not labeled) of the flat body 106 in a direction inclined with respect to the vertical axis of the flat body 106. In an embodiment of the present invention, the spring arm 116 is substantially perpendicular to the primary surface to comply with the moving direction A of the pin leg 90 of the electronic device. The spring arm 116 functions to resiliently engage the pin leg 90. In this respect, it is preferred that the spring arm 116 is slightly inclined with respect to a surface perpendicular to the first surface (and thus inclined with respect to the first surface too) as viewed in the top plan view (FIGS. 7 and 8) to ensure the resilient engagement.

Although in the embodiment illustrated, the moving direction A of the pin leg 90 is substantially perpendicular to the flat body 106, it is apparent that the moving direction of the pin leg 90 can be made substantially parallel to the first surface of the flat body 106 as indicated by arrow B without departing the spirit of the present invention.

Figure 9:
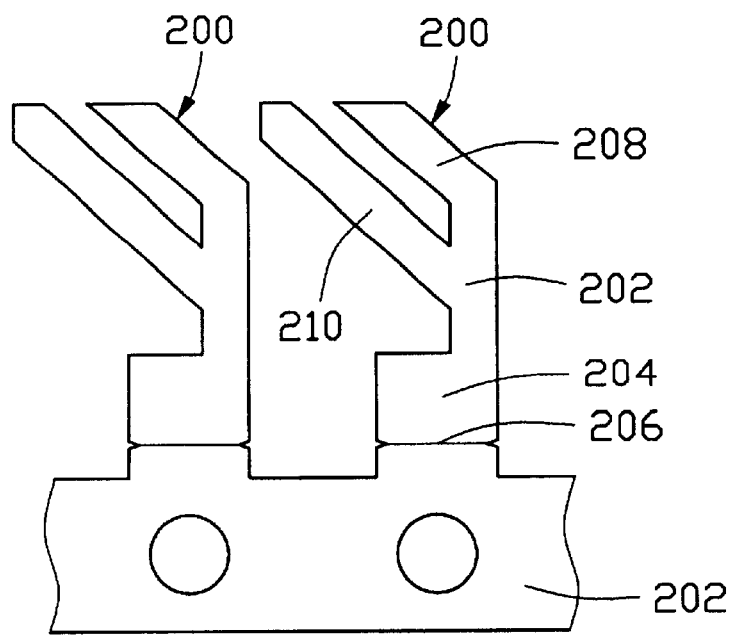
FIG. 9 is a plan view showing a number of contact blanks mounted to a carrier strip, the contact blanks being further processed to each form the contact of the present invention.

Also referring to FIG. 9, the contact 100 of the present invention is made by stamping a metal plate (not shown). The stamping operation forms a number of contact blanks 200 attached to and spaced along a longitudinally-extending carrier strip 202 that partly constitutes the metal plate. Each contact blank 200 will finally form a contact 100 after subsequent processing. The contact blank 200 comprises an elongate main portion 202 extending along a transversely extending axis. The main portion 202 corresponds to the flat body 106 of the finally formed contact 100 and the transversely-extending axis of the main portion 202 corresponds to the vertical axis of the flat body 106. The elongate main portion 202 has an enlarged first end 204, corresponding to the soldering pad 108 of the contact 100, attached to the carrier strip 202 by a ready-to-separate connection line 206. The enlarged first end 204, after separated from the carrier strip 202, is bent an angle, such as approximately 90 degrees, to form the soldering pad 108. The elongate main portion 202 has a first inclined extension 208 from a second end of the main portion 202 in a direction inclined with respect to the transversely extending axis. The first inclined extension 208 corresponds to the retaining arm 112 which may be subject to slight deformation or twist for ensuring secure retention of the contact 100 in the cell 102 of the housing 104.

The contact blank 200 further comprises a second inclined extension 210 projecting from a side edge of the main portion 202, between the first inclined extension 208 and the enlarged end 204, in a direction inclined with respect to the transversely-extending axis of the main portion 202. The second inclined extension 210 corresponds to the spring arm 116 of the finally formed contact 100. In this respect, to maximize deformability of the spring arm 116 for reducing the force required to move the pin leg 90 into contact with the spring arm 116, the second inclined extension 210 is oriented in a direction to have a maximum length and thus minimum rigidity. A preferred example of the second inclined extension 210 is at an angle of around 45 degree with respect to the transversely-extending axis of the main portion 202. In addition, to ensure a compact arrangement of the first and second inclined extensions 208, 210, it is preferred to make the first and second inclined extensions 208, 210 substantially parallel to each other.

Figure 7:
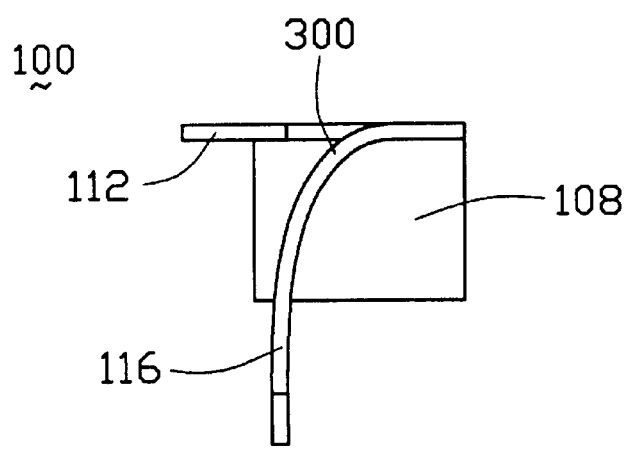
FIG. 7 is a top view of the contact of the present invention.
Figure 8:
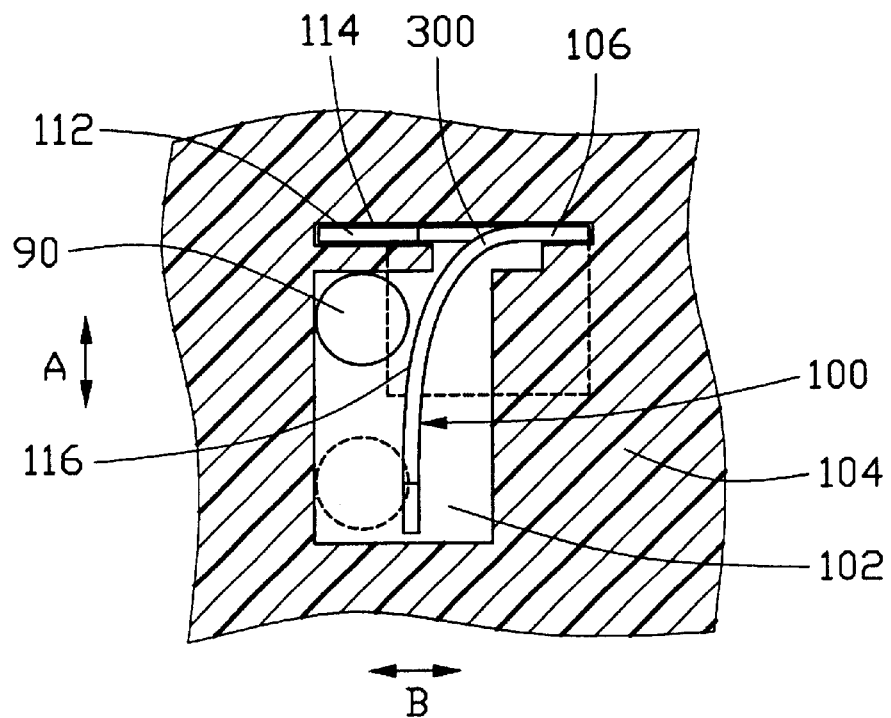
FIG. 8 is a sectional view showing the contact of the present invention fit in a cell defined in a housing of the socket connector.

The second inclined section 210 is bent about the connection between the second inclined section 210 and the main portion 202 to have the second inclined section 210 also inclined with respect to a major surface of the main portion 202. Preferably, the second inclined extension 210 is bent so that, in the finally formed contact 100, an arc portion 300 functioning as lead-in is formed at the connection between the second inclined extension 210 and the main portion 202, as shown in FIGS. 7 and 8, to ensure the resiliency of the spring arm 116 of the finally-formed contact 100.

Since each contact 100 has only a single spring arm 116, each contact blank 200 has a single second inclined section 210 projecting transversely toward the adjacent contact blank 200. The distance between adjacent contact blanks 200 is thus substantially corresponding to the span of one spring arm 116. Hence, the contact blanks 200 can be arranged in a compact manner to save space and material.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A contact made by stamping a metal plate and adapted to be received and retained in a cell defined in a housing of a socket connector, the contact comprising:

a body having a major surface and extending in an axial direction, the body being adapted to be received in the cell;

a soldering pad being formed on a first end of the body by bending an enlarged end portion of the body to be substantially perpendicular to the major surface, the soldering pad being adapted to carry a solder ball;

a retaining arm extending from a second end of the body in an inclined direction with respect to the axial direction, the retaining arm being adapted to interferentially engage a portion of the housing to retain the contact in the cell; and a spring arm being formed by bending an inclined extension from a side edge of the body in an inclined direction about a connection between the spring arm and the body whereby the spring arm is inclined with respect to the major surface, the spring arm being adapted to engage a pin leg of an electronic device inserted into the cell;

wherein the inclined extension from the side edge of the body is substantially parallel to the retaining arm.

2. The contact as claimed in claim 1, wherein the retaining arm is oriented about 45 degree with respect to the axial direction.

3. The contact as claimed in claim 1, wherein the inclined extension from the side edge of the body is approximately 45 degrees with respect to the axial direction.

4. The contact as claimed in claim 1, wherein the retaining arm is slightly deformed.

5. The contact as claimed in claim 1, wherein the contact is arranged in the cell so as to allow the solder ball to at least partially project beyond the housing.

6. An electrical connector comprising:

an insulation housing defining at least an open cell; and a conductive contact received and retained in the cell, the contact comprising:

a body received in the cell, the body having a major surface and extending in an axial direction;

a soldering pad extending from a first end of the body for carrying a solder ball;

a retaining arm extending from a second end of the body in an inclined direction with respect to the axial direction for interferentially engaging a portion of the housing to retain the contact in the cell; and a spring arm extending from a side edge of the body whereby the spring arm is inclined with respect to the major surface and the axial direction;

wherein the spring arm is substantially parallel to the retaining arm.

7. The electrical connector as claimed in claim 6, wherein the retaining arm is slightly deformed to ensure the interferential engagement thereof with the housing.

8. The electrical connector as claimed in claim 6, wherein the contact is arranged in the cell so as to allow the solder ball to at least partially project beyond the housing.

9. The electrical connector as claimed in claim 6, wherein the retaining arm is about 45 degree with respect to the axial direction.

10. The electrical connector as claimed in claim 9, wherein the spring arm is approximately 45 degrees with respect to the axial direction.

* * * * *